(12) United States Patent
Yu et al.

(10) Patent No.: US 8,631,372 B2
(45) Date of Patent: Jan. 14, 2014

(54) SYSTEM AND METHOD OF ELECTROMIGRATION MITIGATION IN STACKED IC DESIGNS

(75) Inventors: Chi-Yeh Yu, Hsinchu (TW);
Chung-Min Fu, Chungli (TW);
Ping-Heng Yeh, Tainan (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 13/477,153

(22) Filed: May 22, 2012

(65) Prior Publication Data

US 2013/0212544 A1 Aug. 15, 2013

Related U.S. Application Data

(60) Provisional application No. 61/597,363, filed on Feb. 10, 2012.

(51) Int. Cl.
*G06F 17/50* (2006.01)

(52) U.S. Cl.
USPC ........................................................ 716/115

(58) Field of Classification Search
USPC ......................................... 716/106–115, 137
See application file for complete search history.

(56) References Cited

U.S. PATENT DOCUMENTS

| | | | |
|---|---|---|---|
| 7,401,304 B2 * | 7/2008 | Li et al. ........................... | 716/111 |
| 8,219,953 B2 * | 7/2012 | Jain et al. ....................... | 716/115 |
| 8,286,111 B2 * | 10/2012 | Chandra et al. ................ | 716/110 |
| 2009/0164183 A1 * | 6/2009 | Smith et al. ........................ | 703/6 |
| 2009/0187869 A1 * | 7/2009 | Jain et al. ........................... | 716/6 |
| 2009/0228856 A1 * | 9/2009 | Park ................................ | 716/13 |
| 2011/0173583 A1 * | 7/2011 | Barwin et al. ................ | 716/106 |
| 2011/0283249 A1 * | 11/2011 | Bickford et al. .............. | 716/132 |
| 2012/0022846 A1 * | 1/2012 | White et al. ..................... | 703/14 |
| 2012/0023471 A1 * | 1/2012 | Fischer et al. ................ | 716/115 |
| 2012/0023472 A1 * | 1/2012 | Fischer et al. ................ | 716/122 |
| 2012/0079438 A1 * | 3/2012 | Paciaroni et al. ............. | 716/103 |

OTHER PUBLICATIONS

"Electromigration Modeling and Full-ship Reliability Analysis for BEOL Interconnect in TSV-based 3d ICs", by Mohit Pathak, Jiwoo Pak, David Z. Pan, and Sung Kyu Lim, IEEE @2011.*
"Sentinel™—TI—An Integrated Die/Package/Board Thermal and Thermal/Mechanical Stress Analysis Solution", Advancing Low-Power Innovation, Apache Design, Inc., 2011, 2 pages, retrieved from www.apache-da.com.
"Encounter Digital Implementation System, The fastest, most predictable path to power, performance, and area realization", Cadence, 2012, pp. 1-6, retrieved from www.cadence.gov.com.

* cited by examiner

*Primary Examiner* — Nha Nguyen
(74) *Attorney, Agent, or Firm* — Duane Morris LLP

(57) ABSTRACT

A computer implemented method comprises accessing a 3D-IC model stored in a tangible, non-transitory machine readable medium, processing the model in a computer processor to generate a temperature map containing temperatures at a plurality of points of the 3D-IC under the operating condition; identifying an electromigration (EM) rating factor, and calculating and outputting from the processor data representing a temperature-dependent EM current constraint at each point.

17 Claims, 8 Drawing Sheets

FIG. 5
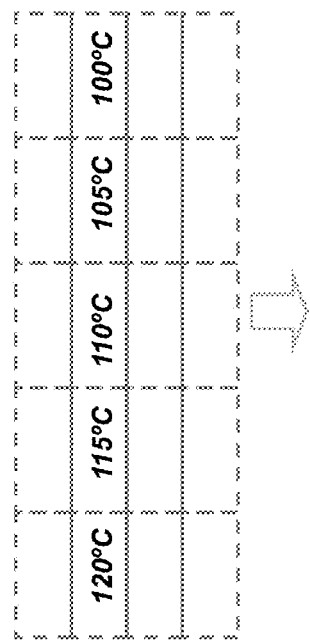
FIG. 5A
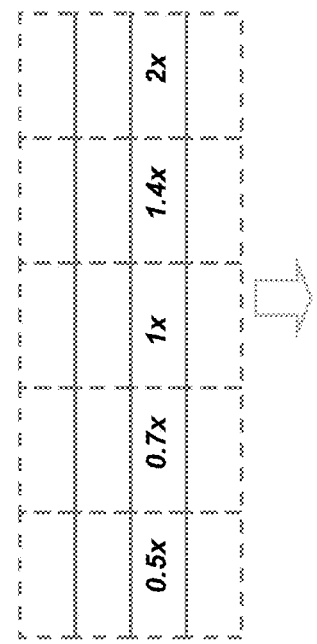
FIG. 5B
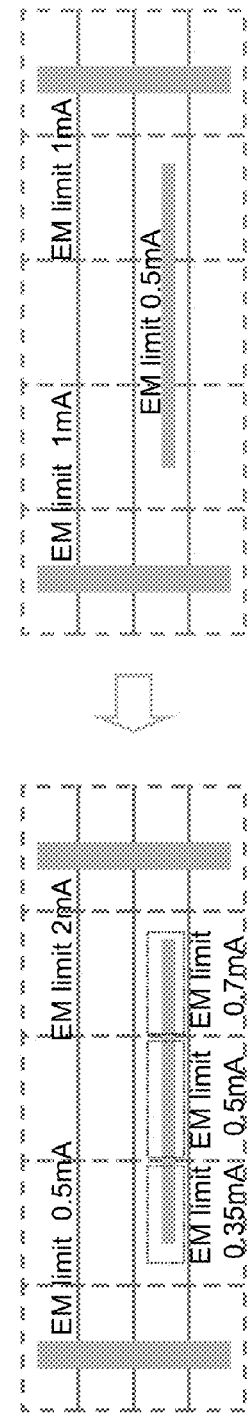
FIG. 5C
FIG. 5D

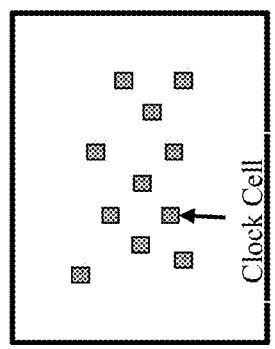
FIG. 6A
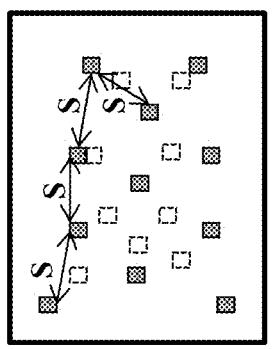
FIG. 6B
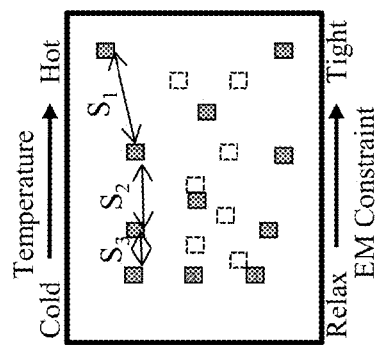
FIG. 6C
FIG. 6

SYSTEM AND METHOD OF ELECTROMIGRATION MITIGATION IN STACKED IC DESIGNS

This application claims the benefit of U.S. Provisional Application No. 61/597,363, filed Feb. 10, 2012, which application is expressly incorporated by reference herein in its entirety.

FIELD

The disclosed system and method relate to semiconductors. More particularly, the disclosed subject matter relates to computer-implemented automated tools for modeling, simulation and design of integrated circuits.

BACKGROUND

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). An alternative packaging technique, referred to as a 2.5D package may use an interposer, which may be formed from a semiconductor material such as silicon, for coupling one or more dies to a substrate. A plurality of IC chips, which may be of heterogeneous technologies, are mounted on the interposer. Connections among the various ICs are routed through conductive patterns in the interposer. These interposer and stacked IC techniques are called 2.5D-IC and 3D-IC, respectively.

Electromigration (EM) decreases the reliability of integrated circuits, and eventually may cause degradation or failure of a semiconductor device. EM is caused by transfer of conductive materials through diffusion of ions or atoms. This phenomenon becomes more important in stacked ICs such as 3D-IC when the interconnect width decreases to hundreds or tens of nanometers.

BRIEF DESCRIPTION OF THE DRAWINGS

FIGS. 5A-5D illustrate an exemplary method for modeling temperature-dependent current constraint in different tiles of a portion of a 3D-IC.

FIGS. 6A-6C illustrate an exemplary method for changing a 3D-IC design by spreading a clock cell distribution network in accordance with one embodiment.

DETAILED DESCRIPTION

Figure 1:
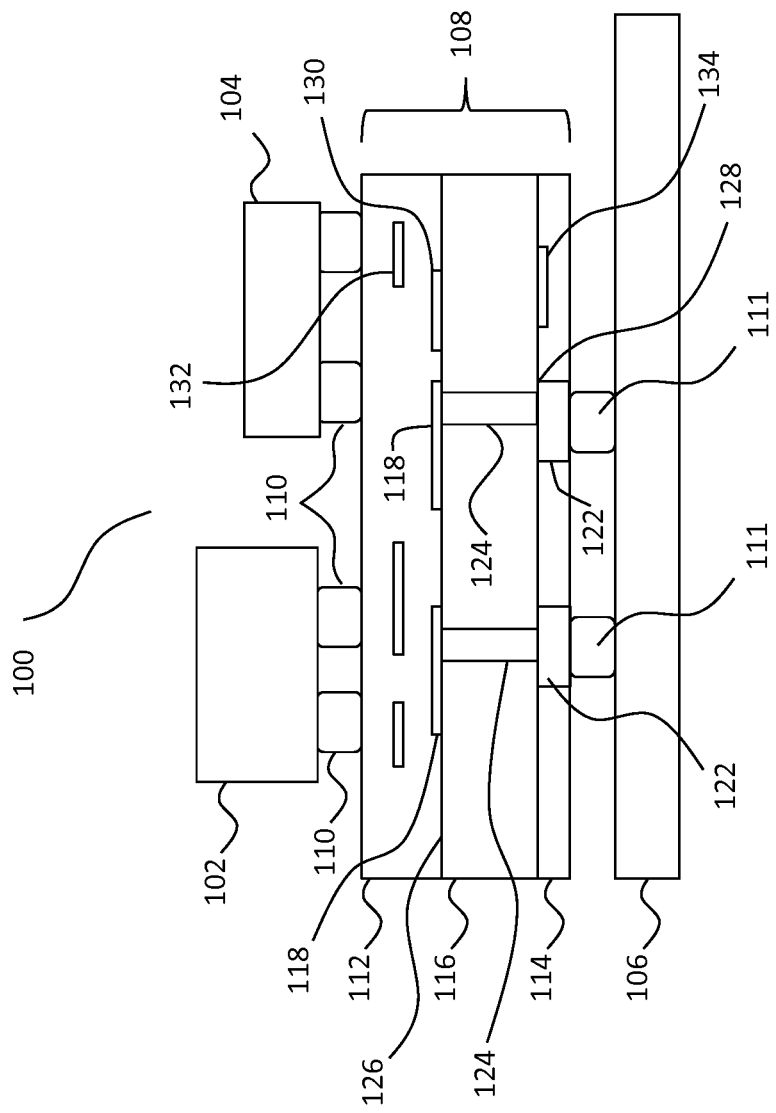
FIG. 1 is a diagram of a 2.5D IC having a semiconductor interposer.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For brevity, references to 3D-ICs made below will be understood to encompass both 2.5D-ICs (including a semiconductor interposer) and 3D-ICs (including vertically stacked dies), unless expressly indicated otherwise.

Some integrated circuit modeling techniques assume the temperature is uniform throughout a 3D-IC device. The inventors have determined that electromigration (EM) is sensitive to temperature. If false-positive EM violations and undetected EM failures occur, problems may result in integrated circuit (IC) design during the life time of devices. Embodiments are described below which mitigate or eliminate electromigration in stacked IC designs.

A method and a system are provided for modeling and simulating a temperature map containing actual temperatures under operating conditions at a plurality of points of a stacked IC design such as a 2.5D- or 3D-IC, and corresponding EM performance at each point prior to, and during, the IC design stage. This computer implemented method and system are suitable for characterizing and designing 2.5D- and 3D-ICs using new technologies, such as new geometries, new materials, new processes or the like. The method and system for mitigating EM provide a new stacked IC design such as a 2.5D- or 3D-IC.

For example, FIG. 1 illustrates one example of a 2.5-dimensional ("2.5D") IC package 100 in which first and second IC chips 102, 104 are coupled to an interposer 108, which is in turn mounted on a package substrate 106. IC chips 102, 104 may be bonded to interposer 108 using small conductive bumps 110, which may be referred to as a "microbump" or "μ-bump". Conductive bumps 111 may also be used to couple interposer 108 to package substrate 106. Microbumps 110 connecting the IC chips 102, 104 to interposer 108 may have different sizes and electrical properties than the bumps 111 connecting the interposer 108 to PCB 106. Interposer 108 includes a semiconductor substrate 116 having front-side and back-side interconnect layers 112, 114 formed on its front and back major surfaces, respectively. In some applications, substrate 116 is not grounded and thus is electrically floating. Front- and back-side interconnect layers 112, 114 each may comprise a plurality of inter-metal dielectric (IMD) layers, which include via level layers (V1, V2, etc.) and metal line level layers (e.g., M1, M2, etc.). As shown in FIG. 1, front-side interconnect structure 112 may include conductors 118, 130 disposed in a first metal layer (i.e., M1) and a conductor 132 disposed in a second metal layer (i.e., M2). Conductor 118 in front-side interconnect layer 112 may be electrically connected to metal conductor 122 in back-side interconnect layer 114 by way of a through-silicon via ("TSV") 124 that extends from front-side surface 126 of semiconductor substrate 116 to rear-side surface 128 of semiconductor substrate 116. Front- and back-side interconnect layers 112, 114 may also include conductors 130, 132, 134 that are not connected to each other.

The embodiments described herein provide a method or system for mitigating EM in designing stacked ICs including 3D-ICs. EM can cause degradation or failure of a semiconductor device. The embodiments described herein provide a method or system for designing 3D-ICs having good reliability.

Figure 2:
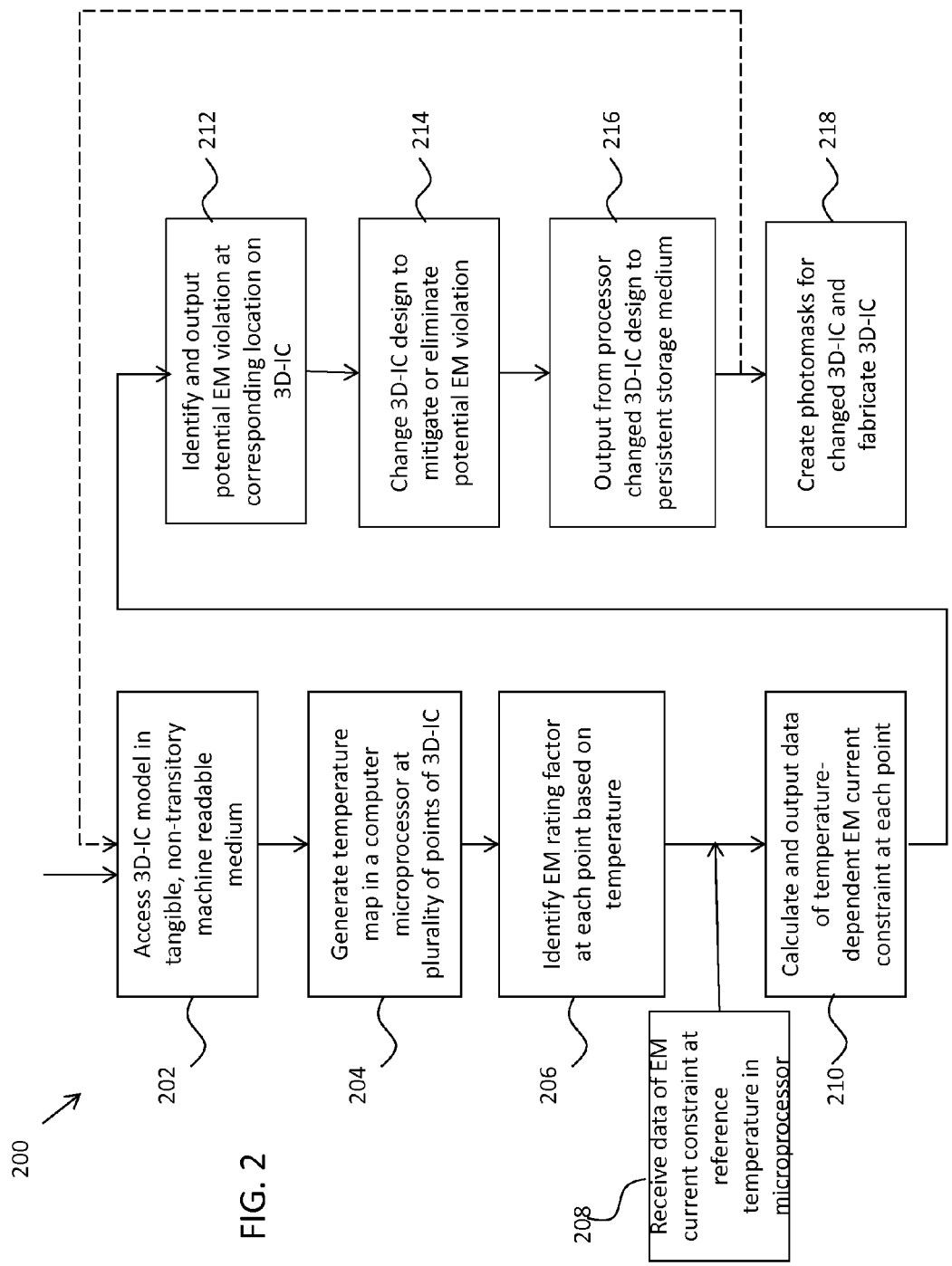
FIG. 2 is a flow chart of a method for characterizing a temperature-dependent EM current constraint and designing a new or revised 3D-IC.

FIG. 2 is a flow chart of a method 200 for characterizing a temperature-dependent EM current constraint and designing a new or revised 3D-IC according to one embodiment.

At step 202, a 3D-IC model stored in a tangible, non-transitory machine readable medium is accessed. The model comprises a plurality of elements representing a 3D-IC design to be fabricated and to be operated under an operating condition. For example, a circuit design may include at least two silicon-based chips, an interposer and conductive microbumps, which are packaged three dimensionally on a substrate. The model may also be a single chip of a 3-D architecture interconnected by TSVs. The 3D-IC model may include any circuit design including plural dies in a single package.

At step 204, the 3D-IC model is processed through one or programs in a computer processor to generate a temperature map containing temperatures at a plurality of points of the 3D-IC based on an input of the 3D-IC model under the operating condition. The simulation at step 204 may be performed using an electronic design automation ("EDA") tool such as "ANSYS Mechanical"™, sold by ANSYS Inc. of Canonsburg, Pa., and "Sentinel-TI"™, sold by Apache Design Solution of San Jose, Calif. as a subsidiary of ANSYS Inc. Other EDA tools may be used, such as, for example, "IC COMPILER"™, sold by Synopsys, Inc. of Mountain View, Calif., having a router such as "ZROUTE"™, also sold by Synopsys; the "VIRTUOSO" custom design platform or the Cadence "ENCOUNTER"® digital IC design platform along with the "VIRTUOSO" chip assembly router 220, all sold by Cadence Design Systems, Inc. of San Jose, Calif.; and "ADVANCED DESIGN SYSTEM (ADS)"™, sold by Agilent. of Santa Clara, Calif. Even under one set of operating conditions such as at room temperature, the temperature at a plurality of points of the 3D-IC may be different. The temperature at a plurality of different points depends on IC structure and varies significantly. For example, the temperature difference may be in the range of 5-30° C.

At step 206, an EM rating factor at a plurality of points of the 3D-IC is identified based on the temperature of each point. The EM rating factor characterizes the EM performance capability of a point at a temperature relative to the EM capability at a reference temperature. As will be understood by one of ordinary skill in the art, the EM performance capability of a point at a specific temperature can be calculated according to Black's equation:

$$MTTF = A j^{-n} e^{\left(\frac{Ea}{kT}\right)}$$

wherein MTTF is the mean time to failure of a semiconductor circuit due to electromigration; A is a constant depending on the properties of materials and the geometry of the interconnects; j is the current density; n is a model parameter; Ea is the activation energy in eV (electron volts); k is Boltzmann constant; T is the absolute temperature in Kelvin (K). The EM performance capability relates to the maximum current constraint before a EM failure at a certain temperature. Accordingly, a higher value of the EM performance capability parameter is desirable. The EM performance capability decreases with an increase in temperature.

In some embodiments, the EM rating factor at a temperature is the EM performance capability at the temperature relative to the EM performance capability at a reference temperature. Depending on temperature, the EM rating factor may be lower or higher than 1. For example, the reference temperature may be 110° C., and the EM rating factor at 110° C. may be 1. The rating factor at 120° C. and 100° C. may be 0.5 and 2, respectively.

At step 208, data of the EM current constraint at a reference temperature is received in the computer processor. The EM current constraint data at a reference temperature are calculated based on the assumption that the temperature is the same at a plurality of points in a 3D-IC under the given set of operating conditions. In other words, the temperature is uniform throughout the 3D-IC under this assumption. The EM current constraints are assigned according to Black's equation as described above.

At step 210, the data representing a temperature-dependent EM current constraint at each of the points of the 3D-IC is calculated by multiplying the corresponding EM rating factor obtained in step 206 at the simulated actual temperature determined in step 204, by the EM current constraint at a reference temperature input at step 208. In some embodiments, the calculation is performed according to the following equation:

$$CC_{(T)} = R_f * CC_{(R)},$$

where $CC_{(T)}$ is the temperature-dependent EM current constraint;

$R_f$ is the EM rating factor at a certain simulated actual temperature;

and $CC_{(R)}$ is the EM current constraint at a reference temperature.

A map showing the temperature-dependent EM current constraint at each point is then output from the processor.

The described embodiments are explained by FIGS. 5A-5D below, but are not limited to these examples.

FIGS. 5A-5D illustrate an exemplary method for modeling temperature-dependent current constraint in different tiles of a portion of a 3D-IC, following steps of 202-210 of FIG. 2.

FIG. 5A is a schematic example showing a temperature map in the different tiles of a portion of a 3D-IC. The temperature data of different tiles are obtained following steps 202 and 204 of FIG. 2 in System 300 using the temperature model 322. System 300 is described below in FIG. 3.

FIG. 5B illustrates the EM temperature rating factors in the different tiles of the 3D-IC of FIG. 5A. The EM rating factors are obtained following steps 206 of FIG. 2 in system 300 using the EM or power consumption model. System 300 is described below in FIG. 3.

FIG. 5C illustrates the EM current constraint assigned at a reference temperature based on an assumption that the temperature is uniform through a 3D-IC. The data is input following step of 208 of FIG. 2.

FIG. 5D illustrates the temperature-dependent EM current constraint data at each tile by multiplying the EM current constraint at a reference temperature by the corresponding EM rating factor.

At step 212 of FIG. 2, a potential EM violation is identified by analyzing EM on the 3D-IC and applying the temperature-dependent EM current constraint. An indicator representing the potential EM violation and a corresponding location is output from the processor. The indicator is output when the analysis identifies that the current at one point of the 3D-IC is higher than the temperature-dependent electromigration current constraint.

At step 214, the 3D-IC design is changed to mitigate the potential electromigration violation. The second 3D-IC design is different from the first 3D-IC design in step 202. At step 216, the changed 3D-IC design is output and received from the processor to a persistent machine readable storage medium.

In some embodiments, the 3D-IC design may be changed by spreading a clock distribution network out to increase a spacing between at least two cells in the clock distribution network; or adjusting a pitch of a power mesh in the 3D-IC, or by any combination of these two approaches, or the like approach. A clock distribution network carries the clock signal that controls the timing in the circuit and generates current at a controlled timing. A power mesh conducts electric current in the circuit.

The spreading of the clock distribution network may be performed so that a spacing between one clock cell and its neighboring clock cell increases with decreasing magnitude of the temperature-dependent EM current constraint. The adjusting of the power mesh in the 3D-IC may be performed so that a pitch of the power mesh in the 3D-IC decreases and a density of conductive lines in the power mesh increases with decreasing magnitude of the temperature-dependent EM current constraint.

The described embodiments are explained by FIGS. 6-8 below, but are not limited to these examples.

FIGS. 6A-6C illustrate an exemplary method for changing a 3D-IC design by spreading a clock cell distribution network in accordance with one embodiment. The 3D-IC design is changed to mitigate or eliminate potential EM violation, following step 214 of FIG. 2.

FIG. 6A illustrates a clock cell distribution before changing a 3D-IC design. FIG. 6B illustrates a method of spreading the clock cells with the same spacing to mitigate EM violation. FIG. 6C illustrates a method for spreading the clock cell based on the temperature-dependent EM current constraint. The spreading is performed so that a spacing between one clock cell and its neighboring clock cell increases with decreasing magnitude of the temperature-dependent EM current constraint, while the temperature at a specific location increases. For example, as shown in FIG. 6C, S1 is larger than S2, which is larger than S3.

Figures 7, 7A, 7B:
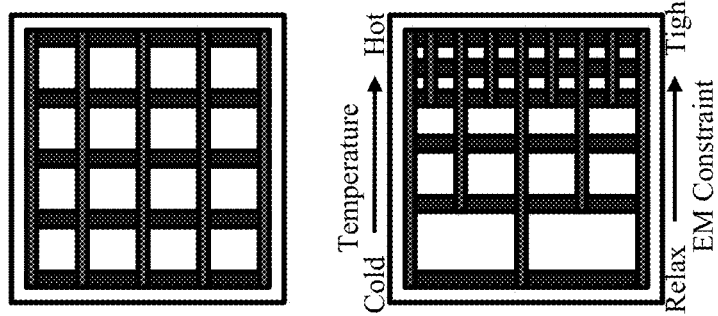
FIGS. 7A-7B illustrate an exemplary method for changing a 3D-IC design by adjusting a pitch of a conductive power mesh in accordance with one embodiment.

FIGS. 7A-7B illustrate an exemplary method for changing a 3D-IC design by adjusting a pitch of a conductive power mesh in accordance with one embodiment. The 3D-IC design is changed to mitigate or eliminate potential EM violation, following step 214 of FIG. 2.

FIG. 7A illustrates a power mesh with uniform pitch before changing a 3D-IC design. FIG. 7B illustrates a method of adjusting pitch of power mesh using temperature-dependent EM constraints to mitigate or eliminate EM violation. The adjusting is performed so that a pitch of the power mesh in the 3D-IC decreases and a density of conductive lines in the power mesh increases with decreasing magnitude of the temperature-dependent EM current constraint, while the temperature at a specific location increases.

FIGS. 8A-8E are schematic diagrams illustrating an exemplary method for mitigating electromigration through clock tree synthesis (CTS) and temperature-dependent power budget. The 3D-IC design is changed to mitigate or eliminate potential EM violation, following step 214 of FIG. 2.

Figures 8A, 8B, 8C, 8D, 8E:
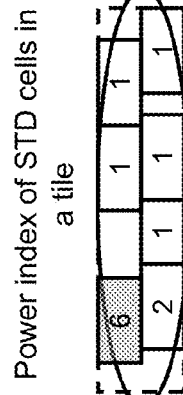
FIGS. 8A-8E are schematic diagrams illustrating an exemplary method for mitigating electromigration through clock tree synthesis (CTS) and temperature-dependent power budget.

FIG. 8A illustrates an exemplary portion of a 3D-IC having different power index compared to assigned power budget. Power index is a parameter representing power consumption. Power index may be equal to power consumption. Power index may also be other parameters significantly related to power consumption. Other parameters may be loading capacitance. The power index/the assigned power budget are represented in the format of m/n, where m is the power index and n is the assigned power budget. The same power budget is assigned based on the EM current constraint at a reference temperature, under an assumption that the temperature is uniform throughout a 3D-IC.

In FIG. 8B, the assigned power budget values are adjusted based on a temperature map obtained following step 204 of FIG. 2. When the temperature increases, n decreases, for example, from 16 to 13 on the three tiles on the left in FIG. 8B.

In FIG. 8C, a clock cell distribution, or called clock tree synthesis (CTS), is introduced. The clock cells time the circuitry to generate electrical current. The additional current increases the power index. For example, for illustration purpose only, suppose each clock cell has a power index of 6. After the clock cells are introduced, if m is higher than n in one tile, an electromigration (EM) violation occurs.

In FIG. 8D, CTS is performed to mitigate or eliminate potential EM violation by changing the location of the clock cells. FIG. 8E shows the power index distribution on an exemplary standard (STD) cell in one tile. The standard cells include, but are not limited to, logic blocks, inverters and buffers.

At step 218 of FIG. 2, the changed design is output from the processor to a persistent storage medium, for fabricating a set of photomasks for the 3D-IC. In some embodiments, steps 202-216 are repeated.

The resulting changed 3D-IC design has improved EM performance capability. The method for the EM analysis and design can be repeated, following steps 202-216, to achieve a new 3D-IC design having the desired performance. This change may involve use of the EDA tool to modify the design and, steps 202 through 216 may be repeated one or more times, until the potential EM violation is eliminated or reduced below an acceptable amount, as indicated by the dashed arrow in FIG. 2.

The changed design is output from the processor to a persistent storage medium, for fabricating a set of photomasks for the 3D-IC at step 218.

In some embodiments, the method further comprises fabricating a set of photomasks for the changed 3D-IC design, and fabricating a 3D-IC based on the changed 3D-IC design.

Figure 3:
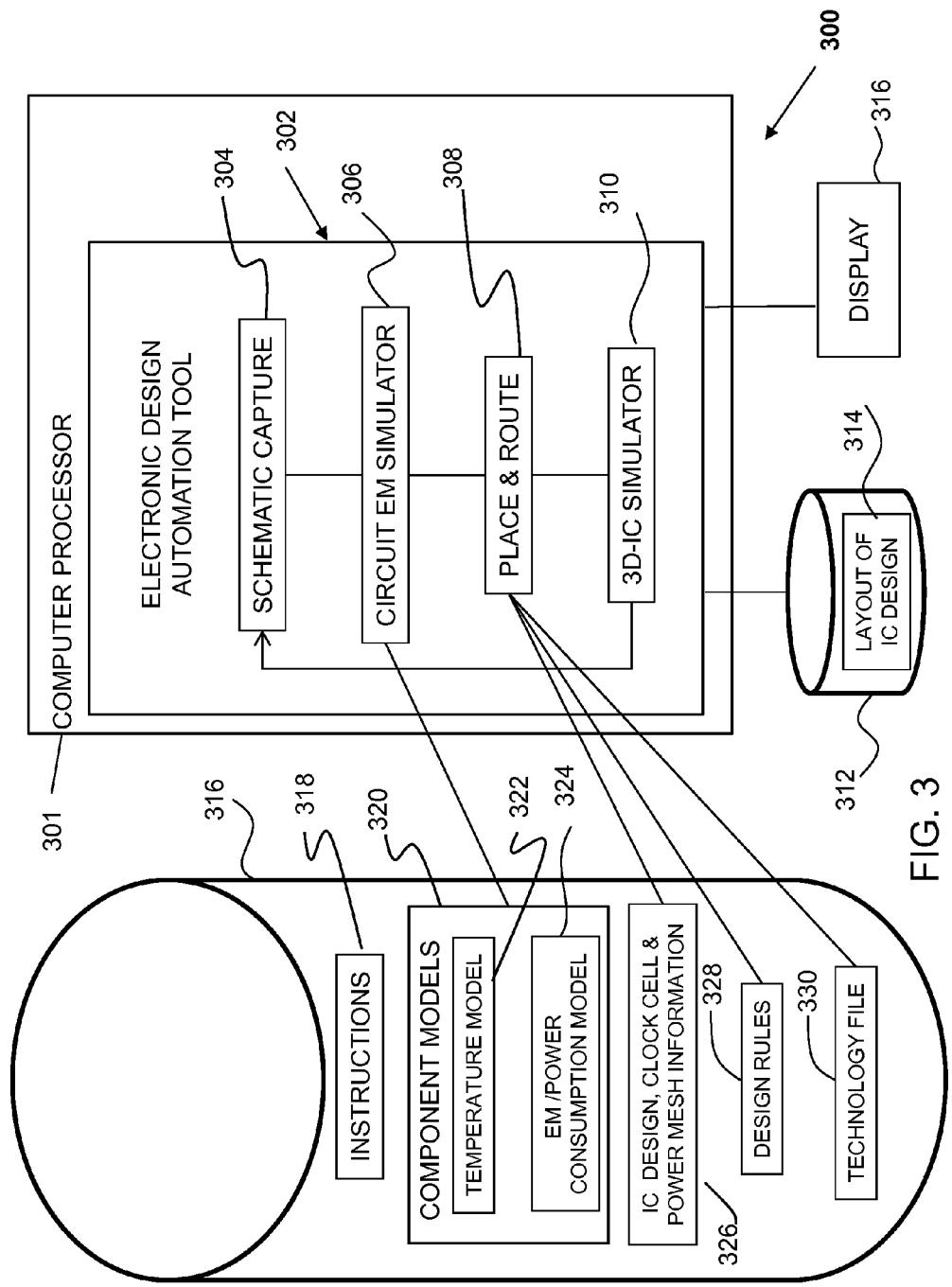
FIG. 3 is a block diagram of a system for modeling and designing a 3D-IC by using the method of FIG. 2.

FIG. 3 is a block diagram of a system for modeling and designing a 3D-IC by using the method of FIG. 2, according to one embodiment.

System 300 includes an electronic design automation ("EDA") tool 302 for analog, radio frequency (RF) and mixed-signal circuits. In some embodiments, system 300 includes a general purpose processor programmed with computer program code that configures the circuits of the processor 301 to function as an EDA tool. Examples of suitable EDA tools include, but are not limited to "ADVANCED DESIGN SYSTEM (ADS)"™, sold by Agilent. of Santa Clara, Calif., which may include a schematic capture tool 304 and a circuit simulator 306 that provides SPICE-level analog and RF simulation. Other EDA tools 302 may be used, such as the "CADENCE® VIRTUOSO® SPECTRE®" circuit simulator, sold by Cadence Design Systems, Inc. of San Jose, Calif.; and "IC COMPILER"™, sold by Synopsys, Inc. of Mountain View, Calif. The processor 301 is programmed to run the tool to analyze a circuit to determine a response of the circuit to an input RF signal, for at least one of designing, manufacturing, and testing the circuit.

In other embodiments, the EDA tool may be implemented in special purpose hardware including application specific integrated circuitry, for example.

EDA tool 302 is a special purpose computer formed by retrieving stored program instructions 318 from a non-transient computer readable storage medium 316 and executing the instructions on a general purpose processor 301. Examples of persistent, non-transient computer readable storage mediums 316 and 312 include, but are not limited to, read only memories ("ROMs"), random access memories ("RAMs"), flash memories, or the like. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

Tangible, non-transient machine readable storage mediums 312, 316 are configured to store inputs 326, 328 and 330 used by the EDA tool 302 and layout of IC design data 314 generated by the place and route tool 308. Input 326 may include information for IC design, clock cell distribution network and power mesh. Input 328 may include design rules. Input 330 may include technology files.

In addition, the medium 312, 316 can store component models 320, such as a temperature simulation model 322, and a temperature-dependent electromigration (EM) or power consumption model 324 used during characterization.

Although FIG. 3 shows an example with two machine readable media 312, 316, any positive integer number of media may be used. Although FIG. 3 shows data schematically organized in certain blocks, these blocks do not necessarily map to a limited single physical arrangement on the media 312, 316. The data may be organized in one or more files and formats, according to the data structures used by the EDA tool.

EDA tool 302 may also include a circuit EM simulation tool 306, which includes the temperature simulation model 322 and the EM model 324. These models are used to perform simulation following steps 202-216 of FIG. 2 as described above. Examples of the EM simulation tool 306 may include "Apache Redhawk"™ and "Apache Totem"™, sold by ANSYS Inc. of Canonsburg, Pa.; and Encounter Power System (EPS) and "VoltageStorm"™, sold by Cadence Design Systems, Inc. of San Jose, Calif.; and "Prime Rail"™, sold by Synopsys, Inc. of Mountain View, Calif. These commercial tools do not have the functions of the embodiments described in this specification.

Place and route tool 308 is capable of receiving an identification of a plurality of standard cells (e.g., clock cells or power mesh cells) to be included in an IC layout. The tool determines where to place the standard cells and the designer's custom circuits within the IC floor plan, and determines where to route the custom conductive paths connecting the cells. Place and route tool 308 may be equipped to use a set of default design rules 328 as well as foundry specific and/or technology node specific parameters included in a tech file 330. The resulting data such as temperature-dependent EM current constraints and potential EM violation at specific locations can later be fed-in to a 3D-IC simulator 310. Examples of suitable 3D-IC simulator tools include, but are not limited to Cadence® Encounter® Digital Implementation (EDI) System, sold by Cadence Design Systems, Inc. of San Jose, Calif. The simulator 310 receives the combined model and performs a simulation, which can now account for a new 3D-IC design.

Together with 3D-IC simulator 310, the temperature simulation model 322 and the EM model 324 in the circuit EM simulator perform steps 202-216 of FIG. 2 as described above. The method for the EM analysis and 3D-IC design can be repeated, following steps 202-216, to achieve a new 3D-IC design having the desired performance. The resulting layout of changed 3D-IC design 314 can be stored in the medium 312. The input and output can be also displayed in a displaying device 316, for example, a monitor.

System 300 may include a display 316 and a user interface or input device such as, for example, a mouse, a touch screen, a microphone, a trackball, a keyboard, or other device through which a user may input design and layout instructions to system 300. The one or more computer readable storage mediums 312, 316 may store other data input by a user.

EDA tool 302 may also include a communication interface allowing software and data to be transferred between EDA tool 302 and external devices. Examples of a communications interface include, but are not limited to, a modem, an Ethernet card, a wireless network card, a Personal Computer Memory Card International Association ("PCMCIA") slot and card, or the like. Software and data transferred via communications interface may be in the form of signals, which may be electronic, electromagnetic, optical, or the like that are capable of being received by communications interface. These signals may be provided to communications interface via a communications path (e.g., a channel), which may be implemented using wire, cable, fiber optics, a telephone line, a cellular link, a radio frequency ("RF") link and other communication channels.

Figure 4:
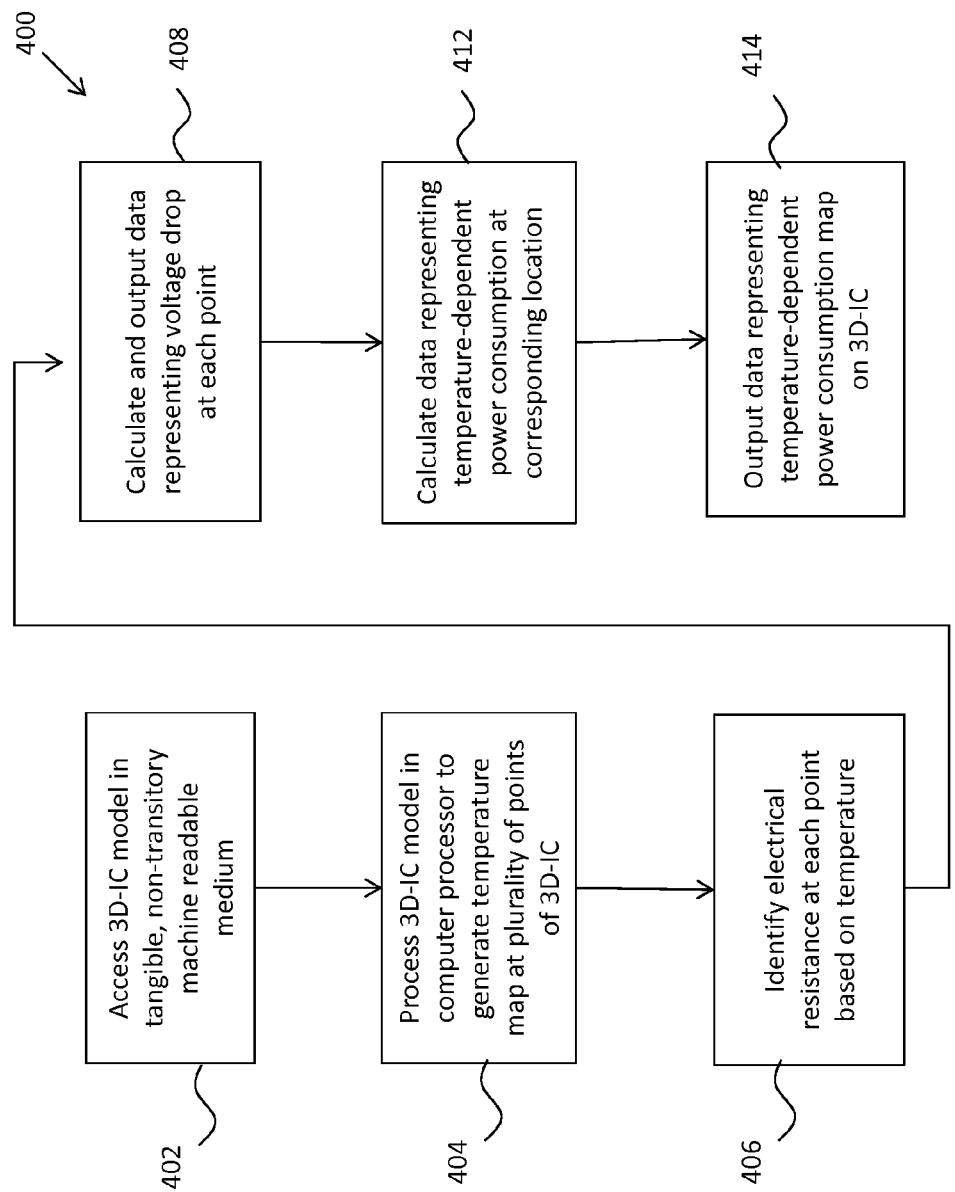
FIG. 4 is a flow chart of a method for characterizing a temperature-dependent IR drop map of a 3D-IC.

FIG. 4 is a flow chart of a method for characterizing a temperature-dependent power consumption map of a 3D-IC.

At step 402, a three-dimensional integrated circuit (3D-IC) model stored in a tangible, non-transitory machine readable medium is accessed. The model comprises a plurality of elements representing a 3D-IC design to be fabricated and to operate under a condition. Step 402 is the same as step 202 of FIG. 2 as described herein.

At step 404, the 3D-IC model is processed in a computer processor, which is programmed to analyze the 3D-IC to calculate a temperature at each of a plurality of points of the 3D-IC operating under the condition. The details of step 404 are the same as those described for step 204 of FIG. 2.

At step 406, a respective electrical resistance is identified at each of the plurality of points at the temperatures calculated at step 404. The interconnect in a 3D-IC may be a metal or other conductive materials. Electrical resistance of such materials changes with temperature based on physics of conductors and semiconductors. Electrical resistance can be calculated based on volume resistivity of a specific material.

At step 408, data representing temperature-dependent power consumption (P) at corresponding location can be calculated based on the resistance (R) and the current (I) according to $P=I^2*R$. The data can be output from the processor at step 412.

At step 414, data representing a voltage drop at each point of the plurality of points is calculated and output from the processor. Such a voltage drop can be calculated based on electrical resistance and current according to Ohm's law as will be understood by an ordinarily skilled person.

These steps can be performed on a system as illustrated in FIG. 3. For example, these steps can be performed on system 300 having an EDA tool 302. Furthermore, this method can further comprise the steps of changing the 3D-IC design based on temperature-dependent power consumption. In some embodiments, the system for performing these functions are provided.

Therefore, one embodiment provides a computer implemented method comprising accessing a three-dimensional integrated circuit (3D-IC) model stored in a tangible, non-transitory machine readable medium. The model comprises a plurality of elements representing a 3D-IC design to be fabricated and to be operated under a condition.

The method further comprises processing the 3D-IC model in a computer processor and generating a temperature map showing a temperature at each of a plurality of points of the 3D-IC operating under the condition. The microprocessor is programmed to analyze the 3D-IC to generate the temperature map.

The method further comprises identifying an electromigration rating factor at each point of the 3D-IC based on the temperature of each point; and calculating and outputting from the processor data representing a temperature-dependent electromigration current constraint at each of the points of the 3D-IC based on the electromigration rating factors.

In some embodiments, the method described above comprises a step of identifying a potential EM violation by analyzing EM on the 3D-IC by applying the temperature-dependent EM current constraint. In some embodiments, the method also comprises a step of outputting from the processor an indicator representing the potential EM violation and a corresponding location.

In some embodiments, the method described above further comprises a step of changing the 3D-IC design to mitigate the potential EM violation. In some embodiments, the method also comprises a step of outputting from the processor the changed 3D-IC design to a persistent storage medium, for fabricating a set of photomasks for the 3D-IC. The 3D-IC design may be changed by spreading a clock distribution network out to increase a spacing between at least two cells in the clock distribution network, or by adjusting a pitch of a power mesh in the 3D-IC, or any combination of these approach, or the like approach.

Another embodiment is directed to a computer implemented system comprising: one or more processors; and at least one tangible, non-transitory machine readable medium encoded with one or more programs. The program or programs are executed by the one or more processors to perform the following process.

The process comprises accessing a three-dimensional integrated circuit (3D-IC) model stored in the tangible, non-transitory machine readable medium. The 3D-IC model comprises a plurality of elements representing an 3D-IC design to be fabricated and to operate under a condition.

The process further comprises processing the 3D-IC model in the computer processor and generating a temperature map showing a temperature at each of a plurality of points in the 3D-IC under an operating condition. The processor is programmed to analyze the 3D-IC design to calculate a temperature at each of a plurality of points in the 3D-IC based on an input of the 3D-IC under the condition.

The process further comprises identifying an electromigration rating factor at each of the plurality of points of the 3D-IC based on the temperature of each point; and calculating and outputting from the processor data representing a temperature-dependent electromigration current constraint at each point of the 3D-IC based on the electromigration rating factors.

In some embodiments, the system described above performs a function of identifying a potential EM violation by analyzing EM on the 3D-IC by applying the temperature-dependent EM current constraint. In some embodiments, the system also comprises a step of outputting from the processor an indicator representing the potential EM violation and a corresponding location.

In some embodiments, the system described above further performs a function of changing the 3D-IC design to mitigate the potential EM violation. The system may also further perform a function of outputting from the processor the changed 3D-IC design to a persistent storage medium, for fabricating a set of photomasks for the changed 3D-IC. The 3D-IC design may be changed by spreading a clock distribution network out to increase a spacing between at least two cells in the clock distribution network, or by adjusting a pitch of a power mesh in the 3D-IC, or any combination of these approach, or the like approach.

Another embodiment is directed to a computer implemented method comprising calculating and outputting data of voltage drops in a 3D-IC. The method comprises accessing a three-dimensional integrated circuit (3D-IC) model stored in a tangible, non-transitory machine readable medium. The 3D-IC model comprises a plurality of elements representing a 3D-IC design to be fabricated and to operate under a condition.

The method further comprises processing the 3D-IC model in a computer processor and generating a temperature map showing a temperature at each of a plurality of points of the 3D-IC operating under the condition. The processor is programmed to analyze the 3D-IC to calculate a temperature at each of a plurality of points of the 3D-IC operating under the condition.

The method further comprises identifying a respective electrical resistance at each of the plurality of points based on the calculated temperatures; and calculating and outputting from the processor data representing a voltage drop at each point of the plurality of points based on the electrical resistance.

Some embodiments are also directed to a tangible, non-transitory machine readable storage medium storing one or more programs, wherein the one or more programs are configured to be executed by one or more processors, to perform the following process.

The process comprises accessing a three-dimensional integrated circuit (3D-IC) model stored in the tangible, non-transitory machine readable medium. The 3D-IC model comprises a plurality of elements representing a 3D-IC design to be fabricated and to operate under a condition.

The process further comprises processing the 3D-IC model in the computer processor and generating a temperature map showing a temperature at each of a plurality of points in the 3D-IC under an operating condition. The processor is programmed to analyze a circuit to generate a response of a temperature map at each point of the circuit based on an input of the circuit under the operating condition.

The process further comprises identifying an electromigration rating factor at each of the plurality of points of the 3D-IC based on the temperature of each point; and calculating and outputting from the processor data representing a temperature-dependent electromigration current constraint at each point of the 3D-IC based on the electromigration rating factors.

In some embodiments, in the storage medium, the function of the one or more programs comprises: changing and optimizing the 3D-IC model design to mitigate electromigration by utilizing the data of the temperature-dependent electromigration current constraint by changing clock distribution in the circuit design. In some embodiment, the function of the one or more programs further comprises: changing and optimizing the 3D-IC model design to mitigate electromigration by utilizing the data of the temperature-dependent electromigration current constraint by pitch of power mesh in the circuit design. Any combination of the described approaches may be used.

In some embodiments, the methods further comprise fabricating a set of photomasks for the changed 3D-IC design, and fabricating a 3D-IC based on the changed design.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A computer implemented method comprising:
accessing a three-dimensional integrated circuit (3D-IC) model stored in a tangible, non-transitory machine readable medium, the model comprising a plurality of elements representing a 3D-IC design to be fabricated and to be operated under a condition;
generating a temperature map in a computer processor based on the 3D-IC model, the temperature map including temperatures at a plurality of points of the 3D-IC based on the 3D-IC operating under the condition;
identifying an electromigration (EM) rating factor at each of the plurality of points based on the 3D-IC; and
outputting data representing a temperature-dependent electromigration (EM) current constraint at each of the plurality of points of the 3D-IC based on the electromigration (EM) rating factors,
wherein
the EM rating factor at each of the plurality of points is calculated based on an EM performance capability of a point at a temperature relative to the EM capability at a reference temperature, the EM performance capability of a point at a temperature being calculated based on the temperature and a current density of the point; and
the temperature-dependent EM current constraint at one of the points of the 3D-IC is obtained based on the corresponding electromigration rating factor and an electromigration constraint at a reference temperature.

2. The method of claim 1, wherein the temperature-dependent electromigration current constraint at one of the points of the 3D-IC is obtained by multiplying the corresponding electromigration rating factor and an electromigration constraint at a reference temperature.

3. The method of claim 1, further comprising:
identifying a potential electromigration violation by analyzing electromigration on the 3D-IC by applying the temperature-dependent electromigration current constraint.

4. The method of claim 3, further comprising:
outputting from the processor an indicator representing the potential electromigration violation and a corresponding location.

5. The method of claim 3, wherein the indicator is output when the analyzing determines that a current at one point of the 3D-IC is higher than the temperature-dependent electromigration current constraint.

6. The method of claim 3, further comprising:
changing the 3D-IC design to mitigate the potential electromigration violation.

7. The method of claim 6, further comprising outputting from the processor the changed 3D-IC design to a persistent storage medium, for fabricating a set of photomasks for the 3D-IC.

8. The method of claim 7, further comprising:
fabricating a set of photomasks for the changed 3D-IC design and fabricating a 3D-IC according to the changed 3D-IC design.

9. The method of claim 6, wherein the 3D-IC design is changed by spreading a clock distribution network out to increase a spacing between at least two cells in the clock distribution network.

10. The method of claim 9, wherein the spreading is performed so that a spacing between one clock cell and its neighboring clock cell increases with decreasing magnitude of the temperature-dependent electromigration current constraint.

11. The method of claim 6, wherein the 3D-IC design is changed by adjusting a pitch of a power mesh in the 3D-IC.

12. The method of claim 11, wherein the adjusting is performed so that a pitch of the power mesh in the 3D-IC decreases and a density of conductive lines in the power mesh increases with decreasing magnitude of the temperature-dependent electromigration current constraint.

13. A computer implemented system comprising:
one or more processors; and
at least one tangible, non-transitory machine readable medium encoded with one or more programs, to be executed by the one or more processors, to perform steps of:
accessing a three-dimensional integrated circuit (3D-IC) model stored in the tangible, non-transitory machine readable medium, the model comprising a plurality of elements representing an 3D-IC design to be fabricated and to operate under a condition;
processing the 3D-IC model in the processor, wherein the processor is programmed to analyze the 3D-IC design to calculate a temperature at each of a plurality of points in the 3D-IC based on an input of the 3D-IC under the condition;
identifying an electromigration (EM) rating factor at each of the plurality of points of the 3D-IC based on the temperature of each point; and
calculating and outputting from the processor data representing a temperature-dependent electromigration (EM) current constraint at each point of the 3D-IC based on the electromigration (EM) rating factors,
wherein
the EM rating factor at each of the plurality of points is calculated based on an EM performance capability of a point at a temperature relative to the EM capability at a reference temperature, the EM performance capability of a point at a temperature being calculated based on the temperature and a current density of the point; and the temperature-dependent EM current constraint at one of the points of the 3D-IC is obtained based on the corresponding electromigration rating factor and an electromigration constraint at a reference temperature.

14. The system of claim 13, wherein the functions of the one or more programs further comprise:

analyzing electromigration on the 3D-IC by applying the temperature-dependent electromigration current constraint, and identifying and outputting from the processor a potential electromigration violation.

15. The system of claim 14, wherein the function of the one or more programs further comprise:

changing and optimizing the 3D-IC design to mitigate electromigration by changing a clock distribution network in the 3D-IC design.

16. The system of claim 13, wherein the function of the one or more programs further comprise:

changing and optimizing the 3D-IC model design to mitigate electromigration by utilizing the data of the temperature-dependent electromigration current constraint by pitch of power mesh in the 3D-IC design.

17. The system of claim 13, wherein the function of the one or more programs further comprise:

outputting from the processor the changed 3D-IC design to a persistent storage medium, for fabricating a set of photomasks for the 3D-IC.

* * * * *